US011255913B2

(12) United States Patent
Teboulle et al.

(10) Patent No.: US 11,255,913 B2
(45) Date of Patent: Feb. 22, 2022

(54) ELECTRICITY METER INCLUDING A CIRCUIT FOR DETECTING AN OPEN OR CLOSED STATE OF A CIRCUIT BREAKER

(71) Applicant: SAGEMCOM ENERGY & TELECOM SAS, Rueil Malmaison (FR)

(72) Inventors: Henri Teboulle, Rueil Malmaison (FR); Christophe Grincourt, Rueil Malmaison (FR); Marc Jeanrot, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/828,762

(22) Filed: Mar. 24, 2020

(65) Prior Publication Data

US 2020/0309856 A1 Oct. 1, 2020

(30) Foreign Application Priority Data

Mar. 25, 2019 (FR) ..................................... 19 03098

(51) Int. Cl.

*G01R 31/327* (2006.01)
*G01R 21/06* (2006.01)
*H02H 7/22* (2006.01)

(52) U.S. Cl.

CPC ......... *G01R 31/3275* (2013.01); *G01R 21/06* (2013.01); *H02H 7/22* (2013.01)

(58) Field of Classification Search

CPC ....... G01R 31/3275; G01R 21/06; H02H 7/22
See application file for complete search history.

(56) References Cited

U.S. PATENT DOCUMENTS

| | | | | |
|---|---|---|---|---|
| 4,075,675 A * | 2/1978 | Burkett | H02H 1/003 | 324/509 |
| 4,924,342 A * | 5/1990 | Lee | H02H 9/001 | 174/DIG. 17 |

(Continued)

FOREIGN PATENT DOCUMENTS

| | | |
|---|---|---|
| CN | 108767977 A | 11/2018 |
| EP | 2304760 A2 | 4/2011 |
| FR | 2987449 A1 | 8/2013 |

*Primary Examiner* — Son T Le
*Assistant Examiner* — Adam S Clarke
(74) *Attorney, Agent, or Firm* — Muncy, Geissler, Olds & Lowe, PC

(57) ABSTRACT

An electricity meter includes at least one phase conductor and a neutral conductor, an internal cut-off device includes at least one phase cut-off member connected in series with the phase conductor, and at least one detector circuit for acting when the internal cut-off device is open to detect whether a circuit breaker of the installation is open or closed. The electricity meter includes coupling components connected, downstream from the internal cut-off device, to an injection conductor selected from the phase conductor and the neutral conductor, and an injection component arranged to apply a reference voltage to the injection conductor via the coupling capacitor; and connection components connected to a measurement conductor selected from the phase conductor and the neutral conductor, and a measurement component arranged to measure a measurement voltage across the terminals of one of the connection components, the measurement voltage being representative of an impedance of the installation.

13 Claims, 1 Drawing Sheet

(56) References Cited

U.S. PATENT DOCUMENTS

2006/0226850 A1* 10/2006 Stitt ..................... G01R 27/18
324/525
2011/0153236 A1* 6/2011 Montreuil .......... G01R 19/2513
702/59

* cited by examiner

[Fig. 1]
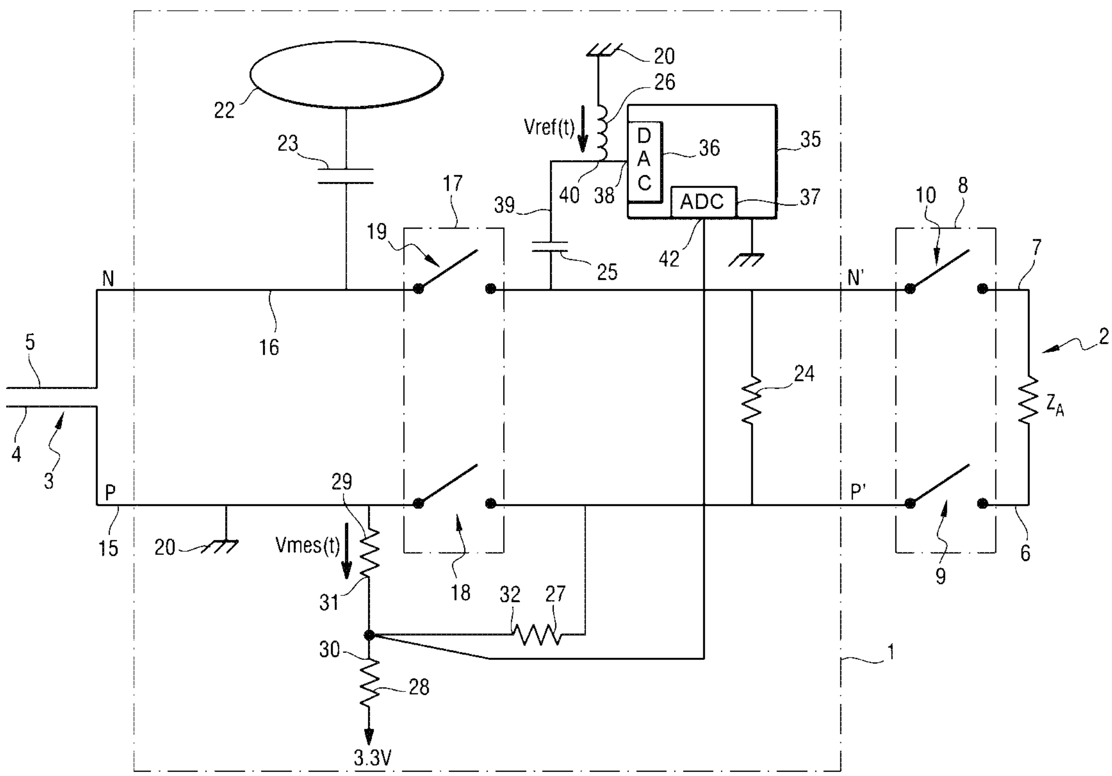
[Fig. 2]
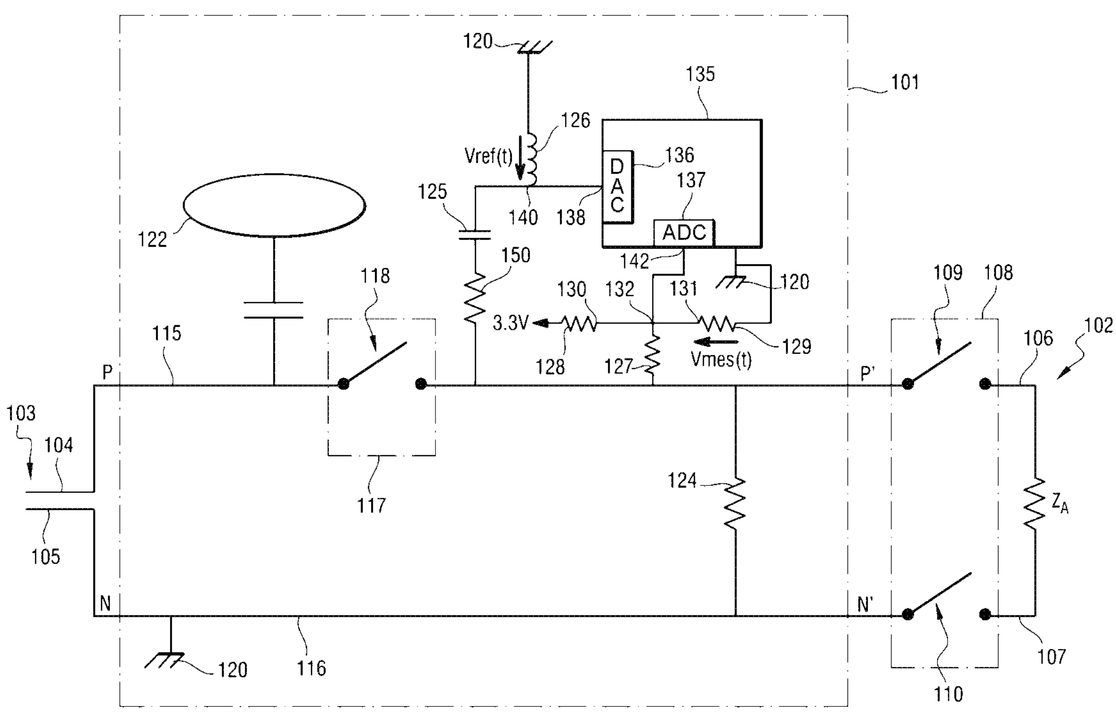

ELECTRICITY METER INCLUDING A CIRCUIT FOR DETECTING AN OPEN OR CLOSED STATE OF A CIRCUIT BREAKER

The invention relates to the field of electricity meters including an internal cut-off device.

BACKGROUND OF THE INVENTION

Modern electricity meters are electronic meters that are said to be "smart", which meters are naturally adapted to measuring the electrical energy delivered by a distributor to an electrical installation via a distribution network, but are also capable of performing a certain number of additional functions: e.g. managing tariffs by receiving instructions, remote meter reading and programming, remote customer information, etc.

Such electricity meters sometimes include an internal cut-off device that enables them to act, either remotely or from the electricity meter itself, selectively to connect the electrical installation to the distribution network, and to disconnect it therefrom.

Thus, the single-phase electricity meters used in certain countries include a phase conductor and a neutral conductor that are connected respectively to a phase line and to a neutral line of the distribution network, and an internal cut-off device comprising a phase cut-off member connected in series with the phase conductor and a neutral cut-off member connected in series with the neutral conductor. The phase cut-off member and the neutral cut-off member open and close simultaneously.

Likewise, the three-phase electricity meters used in certain countries include three phase conductors and a neutral conductor connected respectively to the phase lines and to the neutral line of the distribution network, and an internal cut-off device comprising three phase cut-off members, each connected in series with a respective distinct phase conductor. The phase cut-off members open and close simultaneously.

Certain electricity installations are also provided with a circuit breaker (external to the electricity meter) that is accessible to the subscriber. The circuit breaker serves in particular to protect the subscriber's electrical installation by opening in the event of a surge occurring in the distribution network, e.g. resulting from a short-circuit between two phases or between one of the phases and neutral.

When the internal cut-off device and the circuit breaker are both open and when the supply of electricity is to be reconnected, it is appropriate to re-close the internal cut-off device immediately after re-closing the circuit breaker. In the event of the internal cut-off device and the circuit breaker both being open, the electricity meter must thus be capable, in reliable and robust manner, of detecting that the subscriber has closed the circuit breaker in order to re-close the internal cut-off device.

To perform this detection, proposals have been made to connect a cut-off member having three entry points in series with a phase conductor of an electricity meter. Two entry points of the cut-off member are connected to the phase conductor on either side of the cut-off member. While the cut-off member is open, the powerline communication (PLC) module of the electricity meter uses the third entry point of the cut-off member to inject into the phase conductor a signal corresponding to the PLC carrier (35 kHz to 91 kHz). The current flowing downstream from the cut-off member is then measured, and when it is zero, it is detected that the circuit breaker of the installation is open.

That solution requires the use of a transformer to provide electrical isolation between the PLC module and the third entry point of the cut-off member. However, such a transformer is expensive and large in size.

Furthermore, at present, there does not exist any cut-off member with three entry points that has been developed sufficiently to be suitable for integrating in an electricity meter. That solution is therefore not yet mature.

With a single-phase meter, that solution does not make it possible to detect the state of the circuit breaker when the internal cut-off device comprises a phase cut-off member connected in series with the phase conductor and a neutral cut-off member connected in series with the neutral conductor.

Finally, that solution does not enable detection to be performed while also transmitting PLC signals, which can be a problem.

OBJECT OF THE INVENTION

An object of the invention is to provide an electricity meter that, when its internal cut-off device is open, is capable of detecting whether the circuit breaker of an installation is open or closed, said electricity meter overcoming the weaknesses of the above-describe solution.

SUMMARY OF THE INVENTION

In order to achieve this object, there is provided an electricity meter for measuring the amount of electrical energy that is delivered by a distribution network to an installation, the electricity meter comprising at least one phase conductor and a neutral conductor for connecting respectively to a phase line and to a neutral line of the distribution network, and an internal cut-off device comprising at least one phase cut-off member connected in series with the phase conductor, the electricity meter further including at least one detector circuit for acting when the internal cut-off device is open to detect whether a circuit breaker of the installation is open or closed, and comprising:

- coupling components comprising a coupling capacitor and connected, downstream from the internal cut-off device, to an injection conductor selected from the phase conductor and the neutral conductor, and an injection component arranged to apply a reference voltage to the injection conductor via the coupling capacitor;
- connection components connected to a measurement conductor selected from the phase conductor and the neutral conductor, and a measurement component arranged to measure a measurement voltage across the terminals of one of the connection components, the measurement voltage being representative of an impedance of the installation.

The detector circuit of the electricity meter of the invention thus makes it possible to use the measurement voltage to evaluate the impedance of the installation while the internal cut-off device is open, and from the value of the impedance of the installation, to determine whether the circuit breaker of the installation is open or closed.

The reference voltage is applied via the coupling capacitor, so there is no need to use a transformer.

The operation of the detector circuit does not prevent the PLC communication module, which is advantageously located upstream from the internal cut-off device, from transmitting or receiving PLC signals.

The electricity meter of the invention makes use of an internal cut-off device that is entirely conventional. The components used in the detector circuit of the electricity meter of the invention are simple and inexpensive.

The state of the circuit breaker can be detected regardless of the type of internal cut-off device incorporated in the electricity meter, and in particular when the internal cut-off device includes a phase cut-off member connected in series with the phase conductor and a cut-off member connected in series with the neutral conductor (for a single-phase meter), or else when the internal cut-off device has a plurality of phase cut-off members connected in series with a plurality of phase conductors (for a multi-phase meter).

The electricity meter of invention thus makes it possible, while the internal cut-off device is open, to detect in robust, reliable, and inexpensive manner whether the circuit breaker of the installation is open or closed.

There is also provided an electricity meter as described above, wherein the detector circuit further comprises a processor component arranged to evaluate the impedance of the installation from the measurement voltage, and to use the impedance of the installation to detect whether the circuit breaker of the installation is open or closed.

There is also provided an electricity meter as described above, wherein the processor component, the injection component, and the measurement component are a single component.

There is also provided an electricity meter as described above, the electricity meter comprising a measurement portion and an application portion, and the processor component is a microcontroller of the application portion.

There is also provided an electricity meter as described above, wherein the connection components comprise a resistor bridge including at least one bias resistor.

There is also provided an electricity meter as described above, wherein the coupling components further comprise a coupling resistor, the coupling capacitor being connected to the injection conductor via the coupling resistor.

There is also provided an electricity meter as described above, wherein the coupling components further comprise a coupling inductor connected between the coupling capacitor and an electrical ground of the electricity meter.

There is also provided an electricity meter as described above, wherein the detector circuit further comprises a line resistor connected downstream from the internal cut-off device, between the phase conductor and the neutral conductor.

There is also provided an electricity meter as described above, the electricity meter being a single-phase meter, and the internal cut-off device further comprising a neutral cut-off member connected in series with the neutral conductor, the phase conductor being connected to an electrical ground, the injection conductor being the neutral conductor and the measurement conductor being the phase conductor, the connection components being connected to the phase conductor both upstream and downstream from the internal cut-off device.

There is also provided an electricity meter as described above, the electricity meter being a multi-phase meter having a plurality of phase conductors, the internal cut-off device comprising a plurality of phase cut-off members, each connected in series with a respective one of the phase conductors, the neutral conductor being connected to an electrical ground, the injection conductor being one of the phase conductors and the measurement conductor being the same phase conductor, the connection components being connected to said phase conductor downstream from the internal cut-off device.

There is also provided an electricity meter as described above, comprising a plurality of detector circuits, each associated with a distinct phase conductor.

There is also provided a detection method performed in an electricity meter as described above and serving, when the internal cut-off device of the electricity meter is open, to detect whether a circuit breaker of an installation to which the electricity meter is connected is open or closed, the method comprising the steps of:

- opening the internal cut-off device;
- applying the reference voltage to the injection conductor;
- measuring the measurement voltage;
- evaluating the impedance of the installation;
- detecting whether the circuit breaker is open or closed on the basis of a value for the impedance of the installation.

There is also provided a computer program comprising instructions for enabling a microcontroller of an electricity meter to perform the detection method as described above.

There are also provided with storage means, characterized in that they store a computer program comprising instructions for enabling a microcontroller of an electricity meter to perform the detection method as described above.

The invention can be better understood in the light of the following description of particular, nonlimiting embodiments of the invention.

BRIEF DESCRIPTION OF THE DRAWINGS

Reference is made to the accompanying drawings, in which:

FIG. 1 shows an electricity meter of the invention, the electricity meter being a single-phase meter;

FIG. 2 shows an electricity meter of the invention, the electricity meter being a three-phase meter.

DETAILED DESCRIPTION OF THE INVENTION

With reference to FIG. 1, the description begins with an electricity meter 1 of the invention that is a single-phase meter.

The electricity meter 1 is for measuring the amount of electrical energy that is delivered by a distribution network to an installation 2.

The distribution network comprises a distribution line 3 comprising a phase line 4 and a neutral line 5.

By way of example, the installation 2 is incorporated in the dwelling of a subscriber. The installation 2 comprises one or more pieces of electrical equipment powered by the distribution network. The installation 2 comprises a phase line 6 and a neutral line 7 that are connected, via the electricity meter 1, respectively to the phase line 4 and to the neutral line 5 of the distribution line 3. The installation 2 includes a circuit breaker 8 having a cut-off member 9 connected in series with the phase line 6 and a cut-off member 10 connected in series with the neutral line 7.

The impedance of the installation is written $Z_A$.

The observed impedance of the installation 2 including the circuit breaker and as measured by calculation is written $Z_{A\_M}$. This observed impedance is equal to $Z_A$ when the circuit breaker 8 is closed, and to the measured impedance when the circuit breaker 8 is open.

The electricity meter 1 has an upstream phase terminal P connected to the phase line 4 of the distribution line 3, a downstream phase terminal P' connected to the phase line 6 of the installation 2, an upstream neutral terminal N connected to the neutral line 5 of the distribution line 3, and a downstream neutral terminal N' connected to the neutral line 7 of the installation 2.

Throughout this application, the term "upstream" means on the side of the distribution network, and the term "downstream" means on the side of the installation 2.

The electricity meter 1 has a phase conductor 15 that connects together the upstream phase terminal P and the downstream phase terminal P', and a neutral conductor 16 that connects together the upstream neutral terminal N and the downstream neutral terminal N'.

The electricity meter 1 also has an internal cut-off member 17 comprising a phase cut-off member 18 connected in series with the phase conductor 15 and a neutral cut-off member 19 connected in series with the neutral conductor 16.

The internal cut-off device 17 is suitable for being controlled, either from the electricity meter 1 itself or else from the outside, to open or to close the internal cut-off device 17 selectively.

The phase cut-off member 18 and the neutral cut-off member 19 of the internal cut-off device 17 open and close simultaneously.

The phase conductor 15 is connected to an electrical ground 20 of the electricity meter 1 upstream from the phase cut-off member 18.

The electricity meter 1 also includes a PLC communication module 22. In this example, the PLC communication module 22 is a G3 PLC modem that is connected to the neutral conductor 16 upstream from the neutral cut-off member 19 via a coupling capacitor 23.

The electricity meter 1 also includes a detector circuit for acting when the internal cut-off device 17 is open to detect whether the circuit breaker 8 of the installation 2 is open or closed.

The detector circuit comprises firstly a line resistor 24 connected downstream from the internal cut-off device 17 between the phase conductor 15 and the neutral conductor 16. In this example, the line resistor 24 has resistance equal to 1.5 megohms (MΩ). The line resistor 24 serves to ensure that the maximum value of the impedance observed on the subscriber side (i.e. on the side of the installation 2) does not exceed the resistance of the line resistor 24.

The detector circuit further comprises coupling components that are connected, downstream from the internal cut-off device 17, to an injection conductor selected from the phase conductor 15 and the neutral conductor 16. It should be observed that the term "injection conductor" is used merely to designate that one of the conductors to which the coupling components are connected.

In this example, the injection conductor is the neutral conductor 16.

The coupling components comprise a coupling capacitor 25 connected directly to the neutral conductor 16 and a coupling inductor 26 connected between the coupling capacitor 25 and electrical ground 20. In this example, the capacitance of the coupling capacitor 25 is 10 nanofarads (nF). In this example, the inductance of the coupling inductor 26 is equal to 1 millihenry (mH).

The detector circuit also has connection components are connected to a measurement conductor selected from the phase conductor 15 and the neutral conductor 16. In this example, the measurement conductor is the phase conductor 15. The connection components are connected to the phase conductor 15 upstream and downstream from the internal cut-off device 17. Once more, it should be observed that the term "measurement conductor" is used merely to designate that one of the conductors to which the connection components are connected.

The connection components comprise a first resistor 27, a second resistor 28, and a third resistor 29.

The first resistor 27 is connected to the phase conductor 15 downstream from the phase cut-off member 18. The second resistor 28 is a bias resistor, being biased in this example by a voltage equal to 3.3 volts (V). The third resistor 29 is connected to the phase conductor 15 upstream from the phase cut-off member 18 (and thus to electrical ground 20). The terminal 30 of the second resistor 28 that is not connected to 3.3 V is connected to the terminal 31 of the third resistor 29 that is not connected to the phase conductor 15. The terminal 32 of the first resistor 27 that is not connected to the phase conductor 15 is connected to the terminal 30 of the second resistor 28 and to the terminal 31 of the third resistor 29.

In this example, the first resistor 27 has a resistance of 500 kilohms (kΩ), while both the second resistor 28 and the third resistor 29 have a resistance of 10 kΩ.

The detector circuit also has an injection component arranged to apply a reference voltage to the injection conductor via the coupling capacitor 25.

The injection component is a microcontroller 35, and more precisely it is the microcontroller of an application portion of the electricity meter 1.

Specifically, the electricity meter 1 has a measuring portion that includes a microcontroller, and an application portion that includes another microcontroller (namely the microcontroller 35).

The measuring portion is dedicated in particular to measuring voltage and current for the purpose of evaluating the amount of electrical energy that is consumed by the installation 2. The application portion is dedicated in particular to communicating via the PLC communication module 22, and to managing tariff schedules, loading curves, etc. The measuring portion and the application portion are isolated or "sandboxed", i.e. a malfunction of the application portion cannot disturb the operation of the measuring portion. The measuring portion is not "downloadable", i.e. it is not possible to download software into the measuring portion from the outside. The application portion is downloadable.

The microcontroller 35 incorporates a digital-to-analog converter 36 and an analog-to-digital converter 37.

An output 38 of the microcontroller 35, which is also an output of the digital-to-analog converter 36, is connected both to the terminal 39 of the coupling capacitor 25 that is not connected to the neutral conductor 16, and also to the terminal 40 of the coupling inductor 26 that is not connected to electrical ground 20.

The microcontroller 35 generates and applies the reference voltage Vref(t) to the injection conductor, i.e. to the neutral conductor 16, via the coupling capacitor 25.

The reference voltage Vref(t) is an analog voltage produced by the digital-to-analog converter 36 of the microcontroller 35. The reference voltage Vref(t) is a sinewave signal of peak amplitude $V_A$ and of frequency Y. By way of example, $V_A$ is equal to 1 V.

The frequency Y is a frequency that is high compared with the frequency of the electricity distributed by the distribution network, which in this example is equal to 50 hertz (Hz). In this example, the frequency Y is equal to 120 kilohertz (kHz).

The coupling capacitor 25 and the coupling inductor 26 thus form a coupling circuit. The coupling circuit serves firstly to inject the 120 kHz signal through the coupling capacitor 25 when the internal cut-off device 17 is open, and also to remove the 50 Hz signal via the coupling inductor 26 when the internal cut-off device 17 is closed.

It should be observed that injecting at "high frequency" makes it possible to reduce both the capacitance of the coupling capacitor 25 and also the inductance of the coupling inductor 26, thereby reducing their cost and their size. The 120 kHz signal is also well separated from the upper limit of the PLC carrier (91 kHz), thus making it possible to avoid the detector circuit disturbing PLC communication.

The detector circuit also has a measuring component arranged to measure a measurement voltage across the terminals of one of the connection components.

The measuring component is the microcontroller 35. An input 42 of the microcontroller 35, which is also an import of the analog-to-digital converter 37, is connected both to the terminal 30 of the second resistor 28 and also to the terminal 31 of the third resistor 29. The microcontroller 35 acquires a measurement voltage Vmes(t) across the terminals of the third resistor 29. The measurement voltage Vmes(t) is digitized by the analog-to-digital converter 37.

The detector circuit also includes a processor component that evaluates the impedance $Z_{A\_M}$ of the installation 2 from the reference voltage Vref(t) and from the measurement voltage Vmes(t), and that uses the impedance $Z_{A\_M}$ of the installation 2 to determine whether the circuit breaker 8 is open or closed. The processor component is the microcontroller 35.

There follows an explanation of the operation of the detector circuit.

The measurement voltage Vmes(t) has a peak amplitude equal to $V_B$.

This gives:

$$\frac{Z_{A\_M} \times R_2}{Z_{A\_M} + R_2} = \left[\frac{R \times (V_A - V_B)}{2V_B - 3.3}\right] - R_1 = Z,$$

and thus:

$$Z_{A\_M} = \frac{Z \times R_2}{R_2 - Z},$$

where $R_2$ is the resistance of the line resistor 24, $R_1$ is the resistance of the first resistor 27, and R is the resistance of the second resistor 28 and of the third resistor 29.

It is assumed that, when the circuit breaker 8 is open, the minimum value of the measured impedance $Z_{A\_M}$ of the installation 2 is 200 kΩ, and, when the circuit breaker 8 is closed, the maximum value of the measured impedance $Z_{A\_M}$ of the installation 2 is 20 kΩ.

The microcontroller 35 thus evaluates $Z_{A\_M}$ from the reference voltage and the measurement voltage, and as a function of the value of $Z_{A\_M}$, it detects an open or closed state of the circuit breaker 8.

Thus:

if $Z_{A\_M} \geq 200$ kΩ, the microcontroller 35 detects that the circuit breaker 8 is open;

if $Z_{A\_M} \leq 20$ kΩ, the microcontroller 35 detects that the circuit breaker 8 is closed;

otherwise, the microcontroller 35 produces a warning message for the power line carrier information system (IS), using the PLC communication module 22.

Naturally, the value of $Z_{A\_M}$ that is taken into account by microcontroller 35 could be obtained from a single measurement, or else from a plurality of measurements, and in particular it may be the average of impedance values obtained from a plurality of measurements.

When the microcontroller 35 detects a closed state of the circuit breaker 8, the microcontroller 35 immediately closes the internal cut-off device 17.

It should be observed that the PLC communication module 22 being positioned upstream from the internal cut-off device 17 enables it to operate while the internal cut-off device 17 is open and the detector circuit is detecting the open or closed state of the circuit breaker 8.

It should also be observed that using the microcontroller of the application portion to perform detection is particularly advantageous. Specifically, an already-existing component is used to perform a new function, thereby enabling the cost of this new function and the difficulties of developing it to be reduced.

With reference to FIG. 2, there follows a description of an electricity meter 101 of the invention, which is a three-phase meter.

The distribution line 103 now has three phase lines 104 and one neutral line 105. Only one phase line 104 is shown in FIG. 2.

The installation 102 likewise has three phase lines 106 and one neutral line 107. Only one phase line 106 is shown in FIG. 2.

The three phase lines 106 and the neutral line 107 of the installation 102 are connected to the phase lines 104 and to the neutral line 105 of the distribution line 103 via the electricity meter 101.

The installation 102 includes a circuit breaker 108 having a respective cut-off member 109 connected in series with each phase line 106 and a cut-off member 110 connected in series with the neutral line 107.

The electricity meter 101 has three upstream phase terminals P connected to the phase lines 104 of the distribution line 103, three downstream phase terminals P' connected to the phase lines 106 of the installation 102, an upstream neutral terminal N connected to the neutral line 105 of the distribution line 103, and a downstream neutral terminal N' connected to the neutral line 107 of the installation 102.

The electricity meter 101 has three phase conductors 115 and one neutral conductor 116. Only one phase conductor 115 is shown in FIG. 2.

The neutral conductor 116 is connected to electrical ground 120.

The electricity meter 101 further includes an internal cut-off device 117 having three phase cut-off members 118, each connected in series with a respective one of the phase conductors 115.

Detection is performed by injecting into a single injection conductor, which is constituted by one of the phase conductors 115 of the electricity meter 101. The measurement conductor is the same phase conductor 115.

Once more, the detector circuit comprises a line resistor 124 connected downstream from the internal cut-off device 117 between the phase conductor 115 (which is the injection conductor) and the neutral conductor 116. The line resistor 124 has resistance equal to 1.5 MΩ.

The detector circuit further comprises coupling components connected to the phase conductor 115 downstream from the internal cut-off device 117.

The coupling components comprise a coupling resistor 150 connected directly to the phase conductor 115, a coupling capacitor 125, and a coupling inductor 126. The coupling capacitor 125 is connected between the coupling resistor 150 and the coupling inductor 126. The coupling inductor 126 has one terminal connected to electrical ground 120. The coupling capacitor 125 has both a terminal connected to a terminal of the coupling resistor 150 that is not connected to the phase conductor 115, and also a terminal connected to a terminal of the coupling inductor 126 that is not connected to electrical ground 120.

In this example, the resistance of the coupling resistor 150 is 500 kΩ. In this example, the capacitance of the coupling capacitor 125 is 10 nF. In this example, the inductance of the coupling inductor 126 is equal to 1 mH.

The detector circuit also comprises connection components connected to the phase conductor 115 downstream from the internal cut-off device 117.

The connection components comprise a first resistor 127, a second resistor 128, and a third resistor 129. The connection components are connected to the phase conductor 115 downstream from the internal cut-off device 117.

The first resistor 127 is connected to the phase conductor 115 downstream from the phase cut-off member 118. The second resistor 128 is a bias resistor, being biased in this example by a voltage equal to 3.3 V. The third resistor 129 is connected to electrical ground 120. The terminal 130 of the second resistor 128 that is not connected to 3.3 V is connected to the terminal 131 of the third resistor 129 that is not connected to electrical ground 120. The terminal 132 of the first resistor 127 that is not connected to the phase conductor 115 is connected to the terminal 130 of the second resistor 128 and to the terminal 131 of the third resistor 129.

In this example, the first resistor 127 has a resistance of 500 kΩ, while both the second resistor 128 and the third resistor 129 have a resistance of 10 kΩ.

The detector circuit also has an injection component arranged to apply a reference voltage to the injection conductor via at least one of the coupling components.

The injection component is a microcontroller 135, and more precisely it is the microcontroller of the application portion of the electricity meter 101.

The microcontroller 135 incorporates in particular a digital-to-analog converter 136 and an analog-to-digital converter 137.

An output 138 of the microcontroller 135, which is also an output of the digital-to-analog converter 136, is connected to the terminal 140 of the coupling inductor 126 that is not connected to electrical ground 120.

The microcontroller 135 generates and applies the reference voltage Vref(t) to the injection conductor, i.e. to the phase conductor 115, via the coupling capacitor 125 and the coupling resistor 150.

The reference voltage Vref(t) is an analog voltage produced by the digital-to-analog converter 136 of the microcontroller 135. The reference voltage Vref(t) is a sinewave signal of peak amplitude $V_A$ and of frequency Y.

In this example $V_A$ is equal to 1 V, and the frequency Y is equal to 120 kHz.

The coupling resistor 150, the coupling capacitor 125, and the coupling inductor 126 thus form a coupling circuit. The coupling circuit serves firstly to inject the 120 kHz signal through the coupling capacitor 125 and the coupling resistor 150 when the internal cut-off device 117 is open, and also to remove the 50 Hz signal via the coupling inductor 126 when the internal cut-off device 117 is closed.

It should be observed that injecting at "high frequency" makes it possible to reduce both the capacitance of the coupling capacitor 125 and also the inductance of the coupling inductor 126, thereby reducing their cost and their size.

The detector circuit also has a measuring component arranged to measure a measurement voltage across the terminals of one of the connection components.

The measuring component is the microcontroller 135. An input 142 of the microcontroller 135, which is also an import of the analog-to-digital converter 137, is connected both to the terminal 130 of the second resistor 128 and also to the terminal 131 of the third resistor 129. The microcontroller 135 acquires a measurement voltage Vmes(t) across the terminals of the third resistor 129. The measurement voltage Vmes(t) is digitized by the analog-to-digital converter 137.

The detector circuit further comprises a processor component that evaluates the impedance of the installation from the reference voltage Vref(t) and from the measurement voltage Vmes(t). The processor component is the microcontroller 135.

There follows an explanation of the operation of the detector circuit.

The measurement voltage Vmes(t) has a peak amplitude equal to $V_B$.

This gives:

$$\frac{Z_{A\_M} \times R_2}{Z_{A\_M} + R_2} = \frac{R_0 \times \left[V_B \times \left(2 + \frac{R}{R_1}\right) - 3.3\right]}{V_A \times \frac{R}{R_1} + 3.3 \times \left(1 + \frac{R_0}{R_1}\right) - V_B \times \left(2 + \frac{R + 2R_0}{R_1}\right)} = Z$$

and thus:

$$Z_{A\_M} = \frac{Z \times R_2}{R_2 - Z},$$

where $R_0$ is the resistance of the coupling resistor 150, $R_2$ is the resistance of the line resistor 124, $R_1$ is the resistance of the first resistor 127, and R is the resistance of the second resistor 128 and of the third resistor 129.

It is assumed that, when the circuit breaker 108 is open, the minimum value of the measured impedance $Z_{A\_M}$ of the installation 102 is 200 kΩ, and, when the circuit breaker 108 is closed, the maximum value of the measured impedance $Z_{A\_M}$ of the installation 2 is 20 kΩ.

The microcontroller 135 thus evaluates $Z_{A\_M}$ from the reference voltage and the measurement voltage, and as a function of the value of $Z_{A\_M}$, it detects an open or closed state of the circuit breaker 108.

Thus:

- if $Z_{A\_M} \geq 200$ kΩ, the microcontroller 135 detects that the circuit breaker 108 is open;
- if $Z_{A\_M} \leq 20$ kΩ, the microcontroller 135 detects that the circuit breaker 108 is closed;
- otherwise, the microcontroller 135 produces a warning message for the power line carrier information system (IS), using the G3 PLC modem 122.

When the microcontroller 135 detects a closed state of the circuit breaker 108, the microcontroller 135 immediately closes the internal cut-off device 117.

The electricity meter 101 thus comprises coupling components 125, 126, and 150 and connection components 127, 128, and 129 that are all connected to a single phase conductor 115 (the conductor shown in FIG. 2).

Alternatively, there could be a plurality of detector circuits, each associated with a distinct phase conductor of a multi-phase electricity meter.

The electricity meter would then comprise the coupling components and the connection components for each phase conductor.

The injection components and the measuring components are formed by the microcontroller of the application portion. The digital-to-analog converter (and thus the microcontroller) then has three outputs (for a three-phase meter) each of which is used to inject the reference voltage into a respective one of the phase conductors via the coupling components associated with said phase conductor. The analog digital converter (and thus the microcontroller) has three inputs (for a three-phase meter), each used to measure the measurement voltage across the terminals of the second resistor of the connection components associated with said phase conductor. Each phase conductor is thus both the injection conductor and the measuring conductor for the coupling components and the connection components that are associated therewith.

By replicating a detector circuit on each phase conductor, it is possible to detect an anomaly in the circuit breaker, and in particular to detect different open/closed states for the cut-off members of the circuit breaker, which can only happen when there is a malfunction of the circuit breaker.

Under such circumstances, the microcontroller produces a warning message for the information system (IS). This solution thus makes it possible to provide more elaborate management of anomalies.

Naturally, the invention is not limited to the embodiments described, but covers any variant coming within the ambit of the invention as defined by the claims.

The numerical values described are given to illustrate how the invention can be implemented, and they could naturally be different.

The invention naturally applies to single-phase meters and to multi-phase meters (and not only three-phase meters).

The invention claimed is:

1. An electricity meter for measuring the amount of electrical energy that is delivered by a distribution network to an installation, the electricity meter comprising at least one phase conductor and a neutral conductor for connecting respectively to a phase line and to a neutral line of the distribution network, and an internal cut-off device comprising at least one phase cut-off member connected in series with the phase conductor, the electricity meter further including at least one detector circuit for acting when the internal cut-off device is open to detect whether a circuit breaker of the installation is open or closed, and comprising:

- coupling components comprising a coupling capacitor and connected, downstream from the internal cut-off device, to an injection conductor selected from the phase conductor and the neutral conductor, and an injection component arranged to apply a reference voltage (Vref(t)) to the injection conductor via the coupling capacitor;
- connection components connected to a measurement conductor selected from the phase conductor and the neutral conductor, and a measurement component arranged to measure a measurement voltage (Vmes(t)) across terminals of one of the connection components, the measurement voltage being representative of an impedance of the installation.

2. The electricity meter according to claim 1, wherein the detector circuit further comprises a processor component arranged to evaluate the impedance of the installation from the measurement voltage, and to use the impedance of the installation to detect whether the circuit breaker of the installation is open or closed.

3. The electricity meter according to claim 2, wherein the processor component, the injection component, and the measurement component are a single component.

4. The electricity meter according to claim 2, the electricity meter comprising a measurement portion and an application portion, and the processor component is a microcontroller of the application portion.

5. The electricity meter according to claim 1, wherein the connection components comprise a resistor bridge including at least one bias resistor.

6. The electricity meter according to claim 1, wherein the coupling components further comprise a coupling resistor, the coupling capacitor being connected to the injection conductor via the coupling resistor.

7. The electricity meter according to claim 1, wherein the coupling components further comprise a coupling inductor connected between the coupling capacitor and an electrical ground of the electricity meter.

8. The electricity meter according to claim 1, wherein the detector circuit further comprises a line resistor connected downstream from the internal cut-off device, between the phase conductor and the neutral conductor.

9. The electricity meter according to claim 1, the electricity meter being a single-phase meter, and the internal cut-off device further comprising a neutral cut-off member connected in series with the neutral conductor, the phase conductor being connected to an electrical ground, the injection conductor being the neutral conductor and the measurement conductor being the phase conductor, the connection components being connected to the phase conductor both upstream and downstream from the internal cut-off device.

10. The electricity meter according to claim 1, the electricity meter being a multi-phase meter having a plurality of phase conductors, the internal cut-off device comprising a plurality of phase cut-off members, each connected in series with a respective one of the phase conductors, the neutral conductor being connected to an electrical ground, the injection conductor being one of the phase conductors and the measurement conductor being the same phase conductor, the connection components being connected to said phase conductor downstream from the internal cut-off device.

11. The electricity meter according to claim 10, comprising a plurality of detector circuits, each associated with a distinct phase conductor.

12. A detection method performed by the electricity meter according to claim 1, and serving, when the internal cut-off device of the electricity meter is open, to detect whether the circuit breaker of the installation to which the electricity meter is connected is open or closed, the method comprising the steps of:

- opening the internal cut-off device;
- applying the reference voltage to the injection conductor;
- measuring the measurement voltage;
- evaluating the impedance of the installation;
- detecting whether the circuit breaker is open or closed on the basis of a value for the impedance of the installation.

13. A non-transitory computer-readable storage medium comprising instructions for enabling a microcontroller of the electricity meter to perform the detection method according to claim 12.

* * * * *